United States Patent
Mitsui et al.

(10) Patent No.: US 6,301,443 B1
(45) Date of Patent: Oct. 9, 2001

(54) LOW PROFILE STROBE DEVICE WITH CONDUCTIVE ELASTIC MEMBERS

(75) Inventors: Hajime Mitsui, Izumi; Wataru Imagawa, Fukuchiyama; Isao Oe, Hirakata; Syuji Furukawa, Fukuchiyama; Shinji Ando, Kyoto, all of (JP)

(73) Assignee: West Electric Company, Ltd., Osaka (JP)

( * ) Notice: Subject to any disclaimer, the term of this patent is extended or adjusted under 35 U.S.C. 154(b) by 0 days.

(21) Appl. No.: 08/901,480

(22) Filed: Jul. 28, 1997

(51) Int. Cl.[7] ............................ G03B 15/03; G03B 17/00
(52) U.S. Cl. ............................ 396/176; 396/542
(58) Field of Search ............................ 396/155, 6, 205, 396/206, 160, 315, 176, 542; 174/262–266; 313/49; 362/3, 9

(56) References Cited

U.S. PATENT DOCUMENTS

| | | | |
|---|---|---|---|
| 2,502,291 | * 3/1950 | Taylor | 29/155.5 |
| 3,213,404 | * 10/1965 | Hedstrom | 174/264 |
| 4,295,184 | * 10/1981 | Roberts | 361/406 |
| 4,700,214 | * 10/1987 | Johnson | 174/262 |
| 4,751,126 | * 6/1988 | Oodaira et al. | 428/139 |
| 5,257,166 | * 10/1993 | Mauri et al. | 361/760 |
| 5,278,535 | * 1/1994 | Xu et al. | 338/20 |
| 5,310,966 | * 5/1994 | Iida et al. | 174/254 |
| 5,541,687 | * 7/1996 | Pearson | 396/542 |
| 5,581,316 | * 12/1996 | Kamoda et al. | 396/6 |
| 5,870,290 | * 2/1999 | Chun et al. | 361/790 |
| 6,078,748 | * 6/2000 | Suzuki et al. | 396/6 |

* cited by examiner

*Primary Examiner*—Christopher E. Mahoney
(74) *Attorney, Agent, or Firm*—Renner, Otto, Boisselle & Sklar, LLP

(57) ABSTRACT

A strobe device comprising a circuit substrate including a plurality of conductive elastic members. The plurality of conductive elastic members includes a first portion forming a predetermined electric circuitry. A second portion, if present, forms various electrical contacts external to the circuit substrate, e.g., a battery contact. A third portion, if present, elastically retains terminals of electronic elements and functions as an electrical contact. An insulation member having a first surface integrally internalizing the plurality of conductive elastic members in such a manner that the second portion and third portion are exposed. Further, the electronic elements and the optical elements are electrically and/or mechanically coupled to the circuit substrate via the plurality of conductive elastic members and the insulation member. The third portion is provided entirely within the insulation member when elastically retaining terminals of the electronic elements.

2 Claims, 4 Drawing Sheets

LOW PROFILE STROBE DEVICE WITH CONDUCTIVE ELASTIC MEMBERS

BACKGROUND OF THE INVENTION

1. Field of the Invention

The present invention relates to a strobe device in which an essential part is formed by affixing a flash discharge tube and various electronic elements to a substrate material. In particular, the present invention relates to a strobe device suitably internalized in a single-use camera.

2. Description of the Related Art

A strobe device has circumstances where inadequate luminance is provided around an object to be photographed, e.g., at night time or indoors. Strobe devices are frequently found in the form of an accessory or internalized in cameras, as is well-known to those skilled in the art.

Among internalized strobe devices, those which are internalized in single-use cameras typically include: a printed circuit board having a known conductive pattern formed thereon so as to define a predetermined electric circuit, on which a flash discharge tube, a reflector, an optical panel, switch contacts, battery contacts, and various electronic elements are affixed via known attachment means such as screws or soldering.

Specifically, the flash discharge tube and the reflector are incorporated into the optical panel, for example, so that the optical panel having the reflector, and the like, incorporated therein is affixed as an optical member to the printed circuit board via known attachment means such as screws. At this time, the electrodes of tie flash discharge tube are electrically coupled, via soldering, to connection terminals that are affixed on the printed circuit board, for example.

The terminals of various electronic elements requiring electrical connection are electrically and/or mechanically coupled to the printed circuit board by being soldered to copper land portions formed in predetermined portions of the conductive pattern on the printed circuit board.

Thus, a conventional strobe device internalized in a single-use camera includes a substrate defined by a printed circuit board having a conductive pattern thereon (which is usually composed of a copper foil), so that optical members (e.g., an optical panel) and various electronic elements are electrically and/or mechanically coupled to the substrate via known attachment means.

As a result, conventional strobe devices require a step of incorporating and soldering individual elements to the printed circuit board, thereby impeding the production efficiency.

SUMMARY OF THE INVENTION

A strobe device according to the present invention comprises: a circuit substrate including a plurality of conductive elastic members, the plurality of conductive elastic members including a first portion forming predetermined electric circuitry, and at least one of a second portion functioning as an electrical terminal and a third portion for elastically retaining terminals of electronic elements; and an insulation member integrally internalizing the plurality of conductive elastic members in such a manner that the second portion and the third portion are exposed; and electronic elements and optical elements electrically and/or mechanically coupled to the circuit substrate via the plurality of conductive elastic members and the insulation member.

In one embodiment of the invention, the insulation member comprises a light-transmitting synthetic resin, an optical panel for controlling light emitted from a flash discharge tube being formed in a portion of the insulation member.

Thus, the invention described herein makes possible the advantages of (1) providing a strobe device, in particular a strobe device suitably for being internalized in a single-use camera, in which the number of separate elements is reduced so that the number of steps required in the production thereof is reduced, hence improving the production efficiency and reducing the production cost; and (2) providing a strobe device including a circuit substrate and various electronic elements and optical elements electrically and/or mechanically coupled to the circuit substrate, where the circuit substrate includes a plurality of conductive elastic members (including circuitry components forming predetermined electric circuitry and other electrically-functioning portions to be electrically connected to external components) which are integrally internalized in an insulation member in such a manner that the electrically-functioning portions are exposed.

These and other advantages of the present invention will become apparent to those skilled in the art upon reading and understanding the following detailed description with reference to the accompanying figures.

DESCRIPTION OF THE PREFERRED EMBODIMENTS

Figure 1:
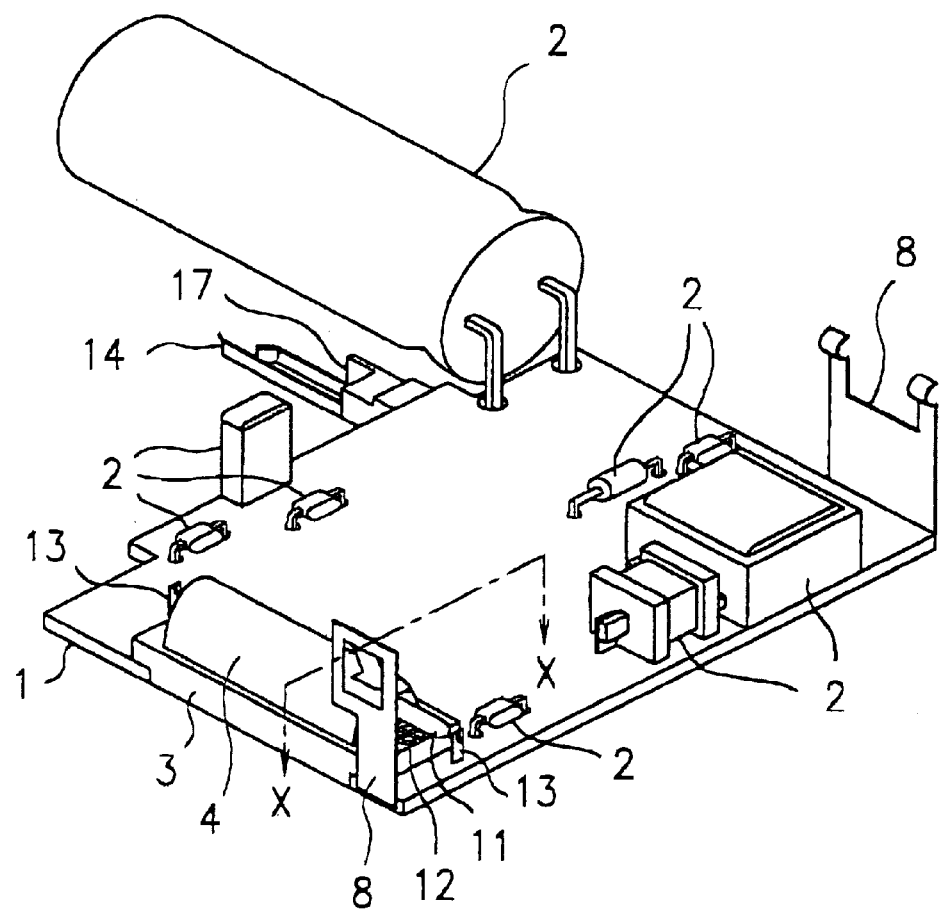
FIG. 1 is a schematic perspective view showing an essential portion of a strobe device according to an example of the present invention.
Figure 2:
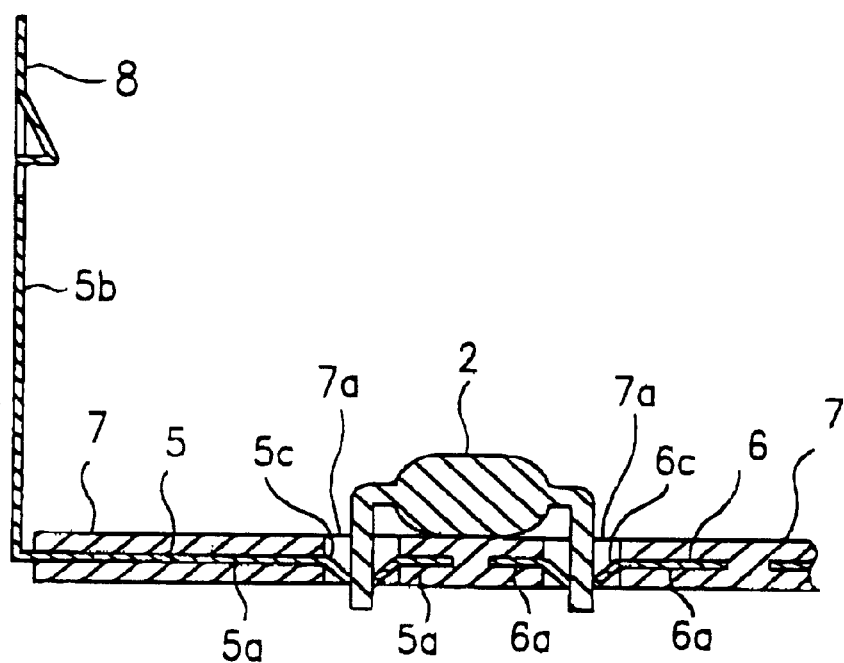
FIG. 2 is an enlarged schematic cross-sectional view showing a portion of the strobe device shown in FIG. 1, taken at line X—X.
Figure 3A:
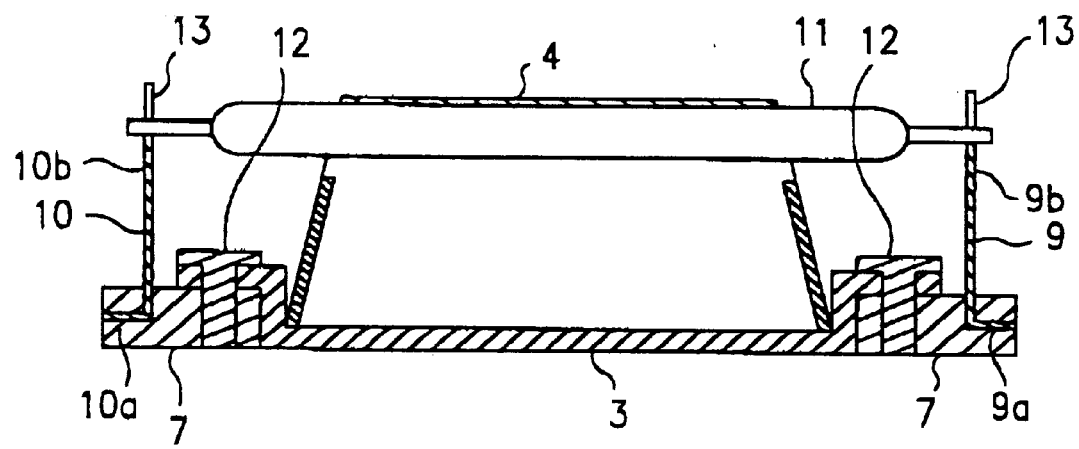
FIG. 3A is an enlarged schematic front view, showing a partial cross-section of the strobe device shown in FIG. 1.
Figure 3B:
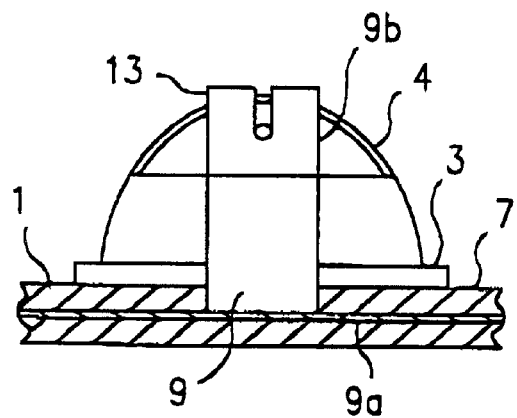
FIG. 3B is an enlarged schematic side view, showing a partial cross-section of the strobe device shown in FIG. 1.
Figure 4:
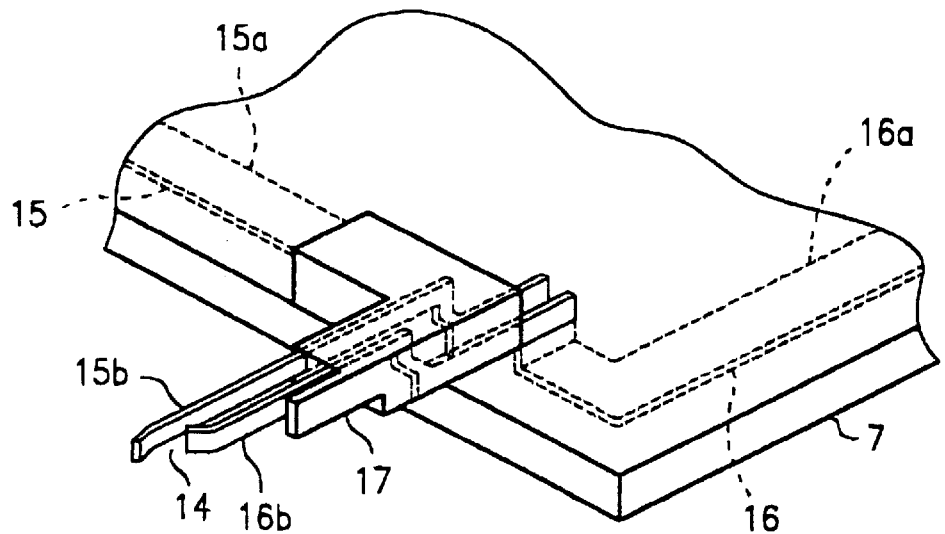
FIG. 4 is an enlarged schematic cross-sectional view showing a portion of the strobe device shown in FIG. 1.

FIGS. 1 to 4 show a strobe device according to an example of the present invention. FIG. 1 is a schematic perspective view showing an essential portion thereof; FIG. 2, FIG. 3A, and FIG. 3B are enlarged schematic cross-sectional views showing portions thereof; and FIG. 4 is an enlarged schematic cross-sectional view showing a portion thereof.

As shown in FIG. 1, the strobe device according to the present example includes a circuit substrate 1, various electronic elements 2 (e.g., resistors, capacitors, transformers, and the like) to be electrically and/or mechanically coupled to the circuit substrate 1, and an optical member (e.g., an optical panel 3) mechanically coupled to the circuit substrate 1 with a screw 12 or the like. A reflector 4 is incorporated in the optical panel 3.

As shown in FIG. 2 illustrating a cross section taken at line X—X in FIG. 1, the circuit substrate 1 includes an plate-like insulation member 7 and a plurality of conductive elastic members including a first conductive elastic member 5, a second conductive elastic member 6, etc.

The first conductive elastic member 5 includes: a first portion 5a forming predetermined electrical circuitry; a second portion 5b functioning as a battery contact 8; and a third portion 5c for elastically retaining the terminals of various electronic elements 2.

The second conductive elastic member 6 includes: a first portion 6a forming predetermined electrical circuitry; and a third portion 6c for elastically retaining the terminals of various electronic elements 2.

The third portions 5c and 6c of the conductive elastic members 5 and 6 are formed, for example, by cutting a plurality of mutually intersecting grooves at the positions where the third portions 5c and 6c are to be formed, and deforming the grooves in a direction along which the electronic elements 2 are inserted, thereby obtaining cross sections of the third portions 5c and 6c such as those shown in FIG. 2.

The second portion 5b and the third portions 5c and 6c define electrically-functioning portions to be connected to external components. Specifically, the second portion 5b extends toward outside, whereas the third portions 5c and 6c are internalized within the insulation member 7 so as to be located in corresponding through holes 7a formed in the insulation member 7.

Thus, the circuit substrate 1 includes the insulation member 7 and a plurality of conductive elastic members 5 and 6, where the conductive elastic members 5 and 6 include: first portions (5a, 6a) forming predetermined electric circuitry; and a second portion (5b) functioning as an electric terminal and/or third portions (5c, 6c) defining electrically-functioning portions or electrical terminals which function in an electrical manner to external components. The insulation member 7 integrally internalizes the plurality of conductive elastic members 5 and 6 so that the second portion (5b) and the third portions (5c, 6c) functioning in an electrical manner to external components are exposed.

FIGS. 3A and 3B are, respectively, enlarged schematic front and side views partially showing cross-sections of the strobe device shown in FIG. 1, including the optical panel 3, the reflector 4, the flash discharge tube 11, and the like. As seen from FIGS. 3A and 3B, the optical panel 3 is affixed to the insulation member 7 of the circuit substrate 1 with a known attachment means, e.g. the screw 12. The insulation member 7 integrally internalizes a pair of third conductive elastic members 9 and 10. The third conductive elastic members 9 and 10 at least include, respectively, first portions 9a and 10a forming predetermined electric circuitry, and second portions 9b and 10b to be electrically and/or mechanically coupled to both electrodes of the flash discharge tube 11 and extending outward from the insulation member 7 to function as electric contacts 13.

Furthermore, as seen from FIG. 4, which is an enlarged schematic cross-sectional view showing a portion of the strobe device shown in FIG. 1 including the vicinity of a switch contact 14 forming a known trigger junction for controlling the excitation operation of the flesh discharge tube 11, the switch contact 14 is formed of fourth and fifth conductive elastic members 15 and 16 integrally internalized within the insulation member 7. The fourth and fifth conductive elastic members 15 and 16 at least include, respectively, first portions 15a and 16a forming predetermined electric circuitry, and second portions 15b and 16b extending outward from the insulation member 7 to function as electric terminals of the switch con tact 14. A projection 17, which Is formed so as to cover a portion of the switch contact 14, controls the elastic characteristics of the switch contact 14 and hence the electrical function thereof The projection 17 may be provided separately from or integrally with the insulation member 7.

In accordance with the strobe device of the present example having the above construction, the second portions (5b, 9b, 10b, 15b, 16b) of the conductive elastic members can be formed in appropriate shapes according to their purposes, so that the respective second portions can be employed as various contacts, thereby eliminating the need of incorporating separate contacts, e.g., battery contacts.

By Inserting the terminals of various electronic elements into the third portions (5c, 6c) of the conductive elastic members, the terminals can be elastically retained therein. As a result, the electronic elements can be electrically and/or mechanically coupled to the third portions without soldering, etc., depending on the desired state of connection therebetween. However, it should be understood that such an advantage of the invention does not deny or prohibit soldering at the third portions.

Figure 5:
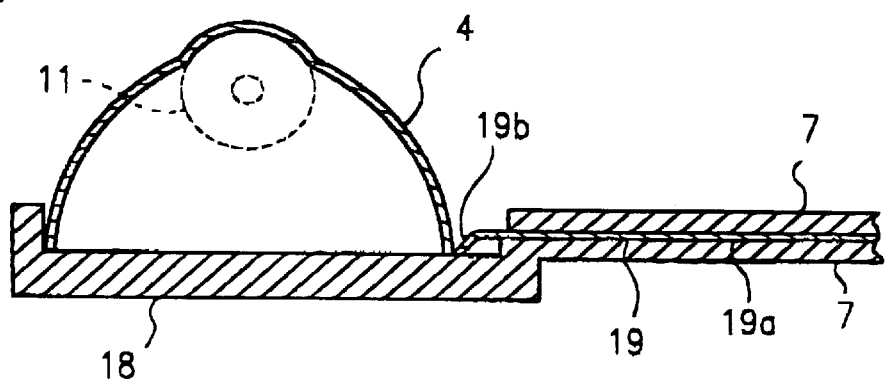
FIG. 5 is a schematic cross-sectional view showing a portion of a strobe device according to another example of the present invention.

FIG. 5 is a schematic cross-sectional view showing a portion of a strobe device according to another example of the present invention, the portion Including a reflector 4, a flash discharge tube 11, and the like.

As shown in FIG. 5, the present example illustrates a case where the insulation member 7 and the optical member 3 in the first example of the invention (which are formed separately) are replaced by an insulation member 7 which is formed of a light-transmitting synthetic resin and integrally includes an optical panel portion 18 for controlling the light emitted from the flash discharge tube 11. Therefore, the strobe device of the present example can be constructed without preparing an optical panel as a separate optical element.

A sixth conductive elastic member 19 includes a first portion 19a internalized in the insulation member 7 and a second portion 19b projecting outward from the insulation member 7 to contact with the reflector 4. The sixth conductive elastic member 19 is electrically and/or mechanically coupled to an output terminal of a trigger transformer (not shown) at an end contiguous with the first portion 19a, so that the sixth conductive elastic member 19 functions as a trigger member for transmitting the output of the trigger transformer to the flash discharge tube 11 via the reflector 4.

As described above, the strobe device according to the present invention includes a circuit substrate and various electronic elements and optical elements electrically and/or mechanically coupled to the circuit substrate, where the circuit substrate includes a plurality of conductive elastic members (including circuitry components forming predetermined electric circuitry and other electrically-functioning portions to be electrically connected to external components) which are integrally internalized in an insulation member in such a manner that the electrically-functioning portions are exposed.

As a result, the above-mentioned electrically-functioning portions can be utilized as various contacts, which are separate elements in conventional strobe devices, thereby reducing the number of components of the strobe device. Thus, not only is the step of incorporating various contacts eliminated, but also the number of molds required for such contacts can be minimized, thereby improving the production efficiency and reducing the production cost.

Since the electrically-functioning portions realize electrical and/or mechanical connection with various electronic elements, soldering can be obviated in certain applications, depending on the desired state of connection therebetween. This would further improve the production efficiency and reduce the production cost.

The number of components of the strobe device can be further reduced by forming an insulation member of a light-transmitting synthetic resin so as to integrally include an optical panel as an optical member.

Various other modifications will be apparent to and dan be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A strobe device comprising:

a circuit substrate including:

a plurality of conductive elastic members, the plurality of conductive elastic members including a first portion forming a predetermined electric circuitry, a second portion functioning as an electrical contact and a third portion for elastically retaining terminals of electronic elements;

an insulation member integrally internalizing the plurality of conductive elastic members in such a manner that the second portion and the third portion are exposed; and electronic elements and optical elements electrically and/or mechanically coupled to the circuit substrate via the plurality of conductive elastic members and the insulation member, wherein the third portion is internalized within the insulation members so as to be located in corresponding through holes existing in the insulation member prior to the insertion of the terminals.

2. A strobe device according to claim 1, wherein the insulation member comprises a light-transmitting synthetic resin, an optical panel for controlling light emitted from a flash discharge tube being formed in a portion of the insulation member.

* * * * *